US 6,636,046 B2

(12) United States Patent
Lee et al.

(10) Patent No.: US 6,636,046 B2
(45) Date of Patent: Oct. 21, 2003

(54) ELECTRICAL RESISTIVITY PROBES

(75) Inventors: Ki Ha Lee, Lafayette, CA (US); Alex Becker, El Cerrito, CA (US); Boris A. Faybishenko, Berkeley, CA (US); Ray D. Solbau, Martinez, CA (US)

(73) Assignee: The Regents of the University of California, Oakland, CA (US)

( * ) Notice: Subject to any disclaimer, the term of this patent is extended or adjusted under 35 U.S.C. 154(b) by 40 days.

(21) Appl. No.: 09/976,860

(22) Filed: Oct. 15, 2001

(65) Prior Publication Data
US 2003/0071604 A1 Apr. 17, 2003

(51) Int. Cl.[7] .......................... G01V 3/02; G01V 3/18; G01R 31/02
(52) U.S. Cl. ........................................ 324/347; 324/355
(58) Field of Search .................. 324/323–375

(56) References Cited

U.S. PATENT DOCUMENTS

| | | | | |
|---|---|---|---|---|
| 4,484,626 A | * | 11/1984 | Kerfoot et al. | 73/152.36 |
| 4,492,111 A | * | 1/1985 | Kirkland | 324/323 |
| 4,875,015 A | * | 10/1989 | Ward | 324/323 |
| 5,767,680 A | * | 6/1998 | Torres-Verdin et al. | 324/355 |
| 5,841,282 A | * | 11/1998 | Christy et al. | 324/347 |
| 5,855,721 A | * | 1/1999 | Monteiro et al. | 324/240 |
| 6,272,232 B1 | * | 8/2001 | Delhomme et al. | 324/338 |
| 6,380,745 B1 | * | 4/2002 | Anderson et al. | 324/347 |

OTHER PUBLICATIONS

Keith L. Bristow et al., "A small multi–needle probe for measuring soil thermal properties, water content and electrical conductivity," Computers and Electronics in Agriculture 31 (2001) 265–280.

* cited by examiner

Primary Examiner—N. Le
Assistant Examiner—Timothy J. Dole
(74) Attorney, Agent, or Firm—Henry P. Sartorio

(57) ABSTRACT

A miniaturized electrical resistivity (ER) probe based on a known current-voltage (I-V) electrode structure, the Wenner array, is designed for local (point) measurement. A pair of voltage measuring electrodes are positioned between a pair of current carrying electrodes. The electrodes are typically about 1 cm long, separated by 1 cm, so the probe is only about 1 inch long. The electrodes are mounted to a rigid tube with electrical wires in the tube and a sand bag may be placed around the electrodes to protect the electrodes. The probes can be positioned in a borehole or on the surface. The electrodes make contact with the surrounding medium. In a dual mode system, individual probes of a plurality of spaced probes can be used to measure local resistance, i.e. point measurements, but the system can select different probes to make interval measurements between probes and between boreholes.

16 Claims, 2 Drawing Sheets

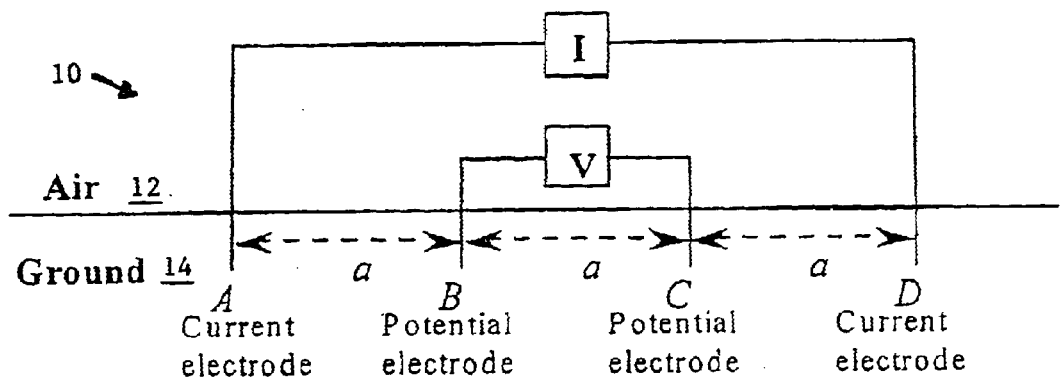
FIG. 1
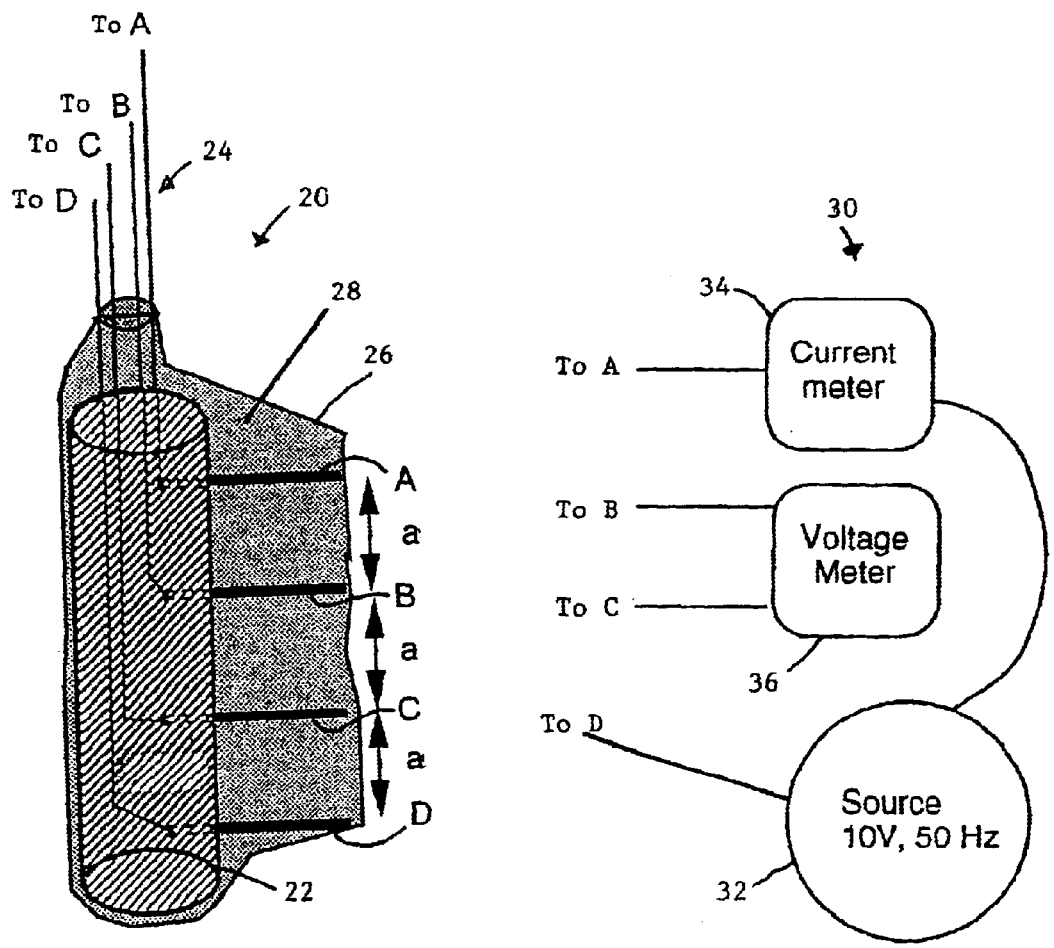
FIG. 2A
FIG. 2B

ELECTRICAL RESISTIVITY PROBES

GOVERNMENT RIGHTS

The United States Government has rights in this invention pursuant to Contract No. DE-AC03-76SF00098 between the United States Department of Energy and the University of California.

BACKGROUND OF THE INVENTION

1. Field of the Invention

The invention relates generally to geophysical instrumentation, and more particularly to instrumentation for electrical resistivity measurements.

2. Description of the Prior Art

The electrical resistivity method is one of the most widely used geophysical methods for investigating subsurface resistivity distribution. In this method, electrical currents are pumped into the ground using two current electrodes, and the resulting potential difference between two arbitrary points is measured by two potential electrodes. The current and potential difference determine the resistivity. The method is easy to implement in the field and the ensuing interpretation is one of the simplest in all geophysical methods. However, the method is adapted only for interval measurements, typically using large plates or spikes for electrodes. It would also be useful to have a system that provides both point measurements and interval measurements.

SUMMARY OF THE INVENTION

Accordingly it is an object of the invention to provide a miniaturized electrical resistivity probe for point measurement.

It is also an object of the invention to provide an array of miniaturized electrical resistivity probes that can be used for both point measurements and interval measurements, in both single-borehole and cross-borehole configurations.

The invention is a miniaturized electrical resistivity (ER) probe based on a known current-voltage (I-V) electrode structure, the Wenner array. But the miniaturized probe is designed for local (point) measurement. The electrodes are typically about 1 cm long, separated by 1 cm, so the probe is only about 1 inch long. The electrodes are mounted to a rigid tube (or other structure) with electrical wires in the tube and a sand bag may be placed around the electrodes to protect the electrodes and maintain good contact with surrounding media. The probe may be attached to a packer that is lowered into a borehole and inflated. The electrodes make contact with the surrounding medium. In a dual mode system, individual probes of a plurality of spaced probes can be used to measure local resistance, i.e. point measurements, but the system can select electrodes in different probes to make interval measurements between probes.

BRIEF DESCRIPTION OF THE DRAWINGS

FIG. 1 shows the electrode configuration of a miniature electrical resistivity probe of the invention.

FIG. 2A illustrates a miniature electrical resistivity probe of the invention.

FIG. 2B illustrates the electrical system connected to the probe of FIG. 2A.

Figure 3:
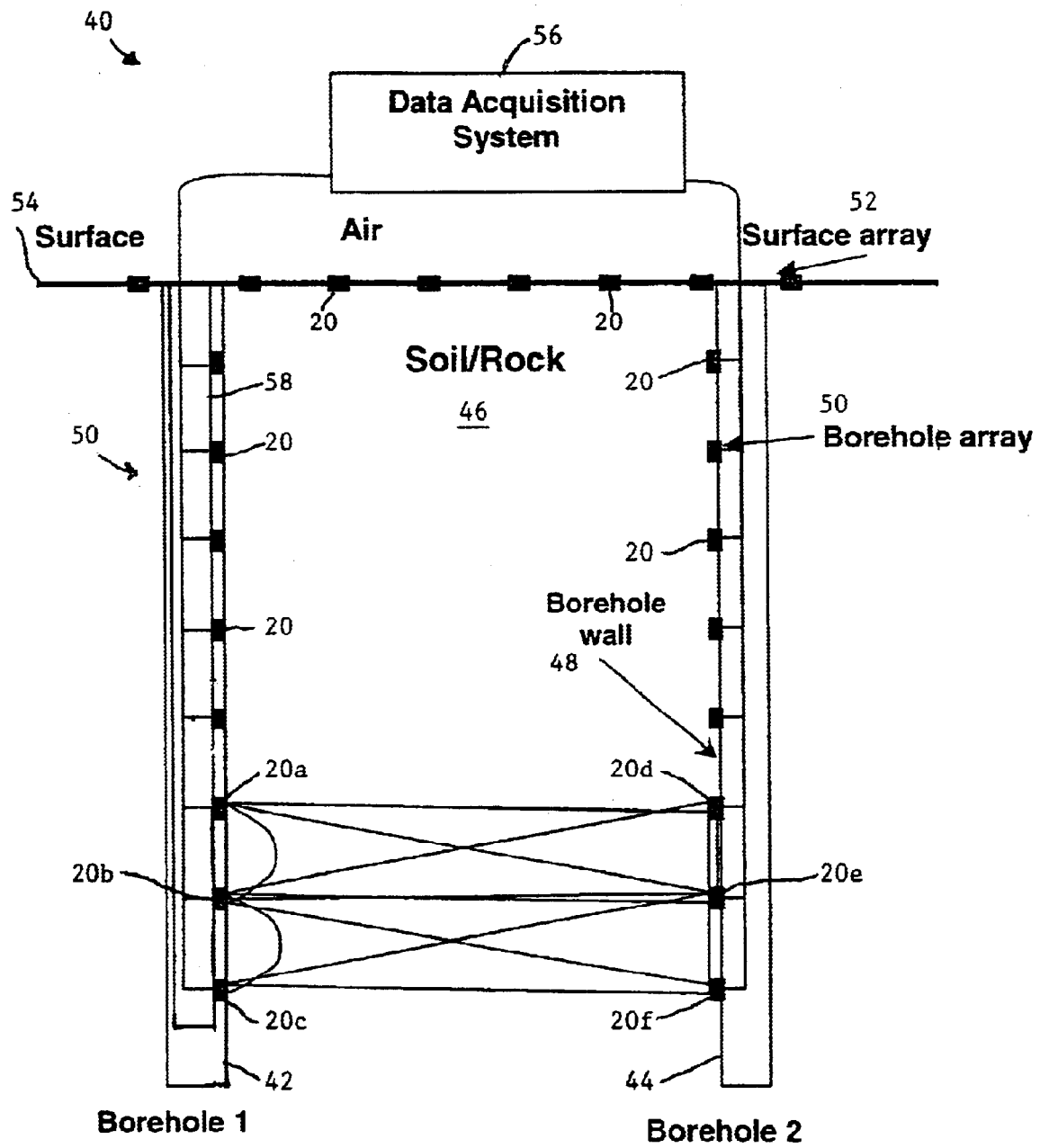
FIG. 3 shows a probe array of the invention which can be used for both point and interval measurements.

DETAILED DESCRIPTION OF THE INVENTION a. Miniature Array for Real-time Monitoring

The invention is a miniature four-electrode array which forms a probe which is installed in a borehole or otherwise positioned to monitor real-time changes in electrical resistivity in a geophysical formation, e.g. during an infiltration test. The electrode configuration is a Wenner array 10 shown in FIG. 1 which has been miniaturized to provide point measurement. The four-electrode array includes two current electrodes A, D and two potential (or voltage) electrodes B, C between the current electrodes A, D. The electrode array 10 is positioned at the air/ground interface between air 12 and ground 14 with electrodes A–D in contact with, or even extending slightly into, the ground 14.

Current electrodes A and D are used to generate an electrical potential in the ground by injecting current (I), and potential electrodes B and C are used to measure the potential difference (V) between electrodes B and C. Each potential electrode is separated from the adjacent current electrode by a distance "a" that is one-third of the separation of the current electrodes (although the electrode spacing can be unequal).

According to the reciprocity principle, potential and current electrodes may be interchangeable without affecting the apparent resistivity of the half space value given by $$\rho_a = 2\pi a(V/I)$$

where $\rho_a$ is the apparent resistivity of a homogeneous medium and is considered a good measure of the average resistivity even when the medium is heterogeneous. If the same array is installed in the whole space, the electrical current density will be exactly halved and result in an apparent resistivity given by $$\rho_a = 4\pi a(V/I).$$

The apparent resistivity is very sensitive to changes in the electrical resistivity of the medium. When the medium in the vicinity of the electrode array is wetted due to infiltration, its electrical resistivity is lowered. The sensitivity of the reduction is proportional to the electrode spacing "a".

An illustrative embodiment of the miniature electrical resistivity (ER) probe 20 is shown in FIG. 2A. Miniature ER probe 20 has four miniature electrodes A, B, C, D which are mounted in a parallel spaced apart relation to a rigid tube (or other structure) 22. The spacing between electrodes is "a" but unequal spacings can also be used. The electrodes A–D are small conducting (e.g. metal) rods which project out from the tube 22 and extend back through the tube 22 into its interior channel. Electrodes A–D are typically about 1 cm long and the electrode spacing "a" is typically about 1 cm. Electrical wires 24 extend into tube 22 and are connected to electrodes A–D. A flexible bag 26, e.g. made of nylon, filled with sand 28 may surround electrodes A–D and tube 22 to protect the electrodes A–D. The wires 24 connected to electrodes A–D extend out of bag 26. In use, the electrodes A–D may contact the geophysical feature being measured through the thin bag 26 or may puncture through the bag 26 and directly contact the feature. Bag 26 with sand 28 may be omitted.

The electrical system 30 that is connected to the probe 20 of FIG. 2A through wires 24, is shown in FIG. 2B. An AC voltage source 32, e.g. a 10 V, 50 Hz source, with a series current meter 34 is connected between electrodes A and D so that a voltage can be applied to cause a measured current to flow in the region between electrodes A and D in the formation being measured. A relatively low voltage can be used since the electrode spacing is small. Thus the geophysical formation forms a path between electrodes A and D to complete the circuit. A voltmeter or other voltage detector 36 is connected between electrodes B and C to measure the voltage drop produced by the current flow between electrodes A and D. This voltage drop is related to the resistivity of the earth between electrodes B and C. Since electrodes B and C are closely spaced, the measurement is essentially a point measurement.

b. Resistivity Tomography

The miniature four-electrode array is very sensitive to resistivity changes in the vicinity of the electrodes, so the array is an ideal tool for real-time monitoring of infiltration tests. Although the array is sensitive to the wetting and drying of the medium in the immediate vicinity of the electrodes, there is no intrinsic information in the measurements in terms of the actual volumetric resistivity distribution on a larger scale.

Information of large-scale resistivity distribution is very important, not only for the regional evaluation of infiltration tests, but for many other purposes involving geophysical imaging. To do this, the utility of the miniature array is extended by combining a plurality of the four electrode probes together into a distributed system, i.e. using each probe as a single electrode of the distributed system. The reconfigured electrode can then be used in an array for probing larger volumes using tomographic measurements, as shown in FIG. 3.

An ER tomographic system 40, shown in FIG. 3, utilizes a plurality of probes 20 shown in FIG. 2A. A pair of boreholes 42, 44 extend down into a soil/rock formation 46. A borehole array 50 made up of a plurality of spaced probes 20 extends along borehole wall 48 of each borehole 42, 44. Probes 20 of borehole array 50 may be positioned using an inflatable packer 58, shown in borehole 42. Similarly, a surface array 52 made up of a plurality of spaced probes 20 extends along the surface 54 of soil/rock formation 46. The probes 20 of the borehole arrays 50 and surface array 52 are connected to data acquisition system 56, which includes the electrical system necessary to actuate and operate the probes 20 and any additional data processing or display systems.

In operation, each probe 20 can be used to measure resistivity at the particular location in the borehole or on the surface at which the probe 20 is positioned. Measurements can also be made between probes to provide interval measurements, i.e. only a single electrode of each probe can be used, or the four electrodes of each probe can be electrically connected to operate as a single electrode. For example, measurements from probe 20a to 20b and from 20b to 20c in borehole 42 can be made. Also, measurements from probes 20a, b c in borehole 42 to probes 20d, e, f in borehole 44 can be made. Thus different probes in different locations may sequentially be selected to map out the region.

Depending on the combination of electrodes, field surveys may be carried out in surface-to-borehole, cross-borehole, or single-borehole configurations. Measurements can be made using pole-pole, pole-dipole, or dipole-dipole arrays. Data obtained using these configurations will then be used to construct interwell resistivity distributions.

Changes and modifications in the specifically described embodiments can be carried out without departing from the scope of the invention which is intended to be limited only by the scope of the appended claims.

What is claimed is:

1. A dual mode distributed measurement system comprising:

a plurality of probes assembled in an array around a geophysical formation, each probe comprising a miniature electrical resistivity probe for geophysical measurements, comprising:

four miniature electrodes;

a mounting structure for mounting the four miniature electrodes in a spaced apart, centimeter-scale-size, parallel relation comprising an outer pair of current electrodes and an inner pair of potential electrodes;

wires connected to the four miniature electrodes and extending out of the mounting structure for connecting the outer pair of electrodes to a voltage source and the inner pair of electrodes to a voltage detector;

a data acquisition system connected to the probes;

wherein a point measurement can be made at each individual probe in utilizing the four electrodes as separate electrodes and interval measurements can be made between pairs of probes by utilizing the four electrodes as a single electrode.

2. The system of claim 1 wherein each electrode comprises a conducting rod.

3. The system of claim 2 wherein each rod is about 1 cm length.

4. The system of claim 3 wherein the electrode spacing is about 1 cm.

5. The system of claim 1 wherein the mounting structure is a rigid tube.

6. The system of claim 1 further comprising a sand filled bag surrounding the electrodes and mounting structure.

7. The system of claim 1 further comprising a voltage source connected to the outer pair of electrodes and a voltage detector connected to the inner pair of electrodes.

8. The system of claim 7 wherein the voltage source comprises an AC voltage source and a series current meter, and the voltage detector comprises a voltmeter.

9. The system of claim 8 wherein the voltage source comprises a 10 V 50 Hz source.

10. The system of claim 1 further comprising a borehole packer on which the probe is mounted, for installing the probe in a borehole.

11. The distributed measurement system of claim 1, wherein the four electrodes of each probe are electrically connected together for interval measurements.

12. An electrical resistance (ER) tomography system, comprising:

a plurality of probes connected in a spaced array on or in the ground, each probe comprising:

four miniature electrodes, a mounting structure for mounting the four miniature electrodes in a centimeter-scale-size, spaced apart, parallel relation, wires connected to the four miniature electrodes;

a data acquisition system connected to the probes for operating each probe in a dual mode;

wherein a point resistivity measurement can be made at each individual probe and interval resistivity measurements can be made between pairs of probes.

13. The ER tomography system of claim 12 wherein the probe ray comprises a borehole array of probes contacting a wall of a borehole extending into the ground.

14. The ER tomography system of claim 13 wherein the probe array comprises a second borehole array of probes contacting a wall of a second borehole.

15. The ER tomography system of claim 14 wherein the probe array further comprises a surface array of probes contacting the ground surface.

16. The ER tomography system of claim 12 wherein each electrode comprises a conducting rod about 1 cm in length with an electrode spacing is about 1 cm.

* * * * *